(12) United States Patent
Ishii

(10) Patent No.: US 8,530,936 B2
(45) Date of Patent: Sep. 10, 2013

(54) SEMICONDUCTOR DEVICE

(75) Inventor: Kazuaki Ishii, Kanagawa (JP)

(73) Assignee: Sumitomo Electric Device Innovations, Inc., Yokohama-shi, Kanagawa (JP)

( * ) Notice: Subject to any disclaimer, the term of this patent is extended or adjusted under 35 U.S.C. 154(b) by 146 days.

(21) Appl. No.: 13/186,009

(22) Filed: Jul. 19, 2011

(65) Prior Publication Data

US 2012/0018735 A1    Jan. 26, 2012

(30) Foreign Application Priority Data

Jul. 20, 2010    (JP) ................................. 2010-163409

(51) Int. Cl.
*H01L 29/66*    (2006.01)
(52) U.S. Cl.
USPC .......................................... 257/192; 257/488
(58) Field of Classification Search
USPC .................................. 257/192, 194, 488, 630
See application file for complete search history.

(56) References Cited

U.S. PATENT DOCUMENTS 7,573,078 B2 *    8/2009    Wu et al. ........................ 257/194

FOREIGN PATENT DOCUMENTS

| JP | 2007-537593 A | 12/2007 |
| WO | 2005/114744 A2 | 12/2005 |

* cited by examiner

*Primary Examiner* — Mark Prenty
(74) *Attorney, Agent, or Firm* — Westerman, Hattori, Daniels & Adrian, LLP

(57) ABSTRACT

A semiconductor device includes a source electrode and a drain electrode formed on an active region of the semiconductor layer, a gate electrode formed on the active region of the semiconductor layer, a first insulating film formed on the semiconductor layer and covering the gate electrode, the first insulating film having a step portion following a shape of the gate electrode, a first field plate formed on the insulating film and located between the gate electrode and the drain electrode and separated from the step portion, a second insulating film formed on the first insulating film to cover the step portion and the first field plate, and a shield electrode formed on the second insulating film, the shield electrode extending from a portion located above the first field plate and a portion located above the gate electrode.

17 Claims, 5 Drawing Sheets

SEMICONDUCTOR DEVICE

CROSS-REFERENCE TO RELATED APPLICATION

This application is based upon and claims the benefit of priority of the prior Japanese Patent Application No. 2010-163409 filed on Jul. 20, 2010, the entire contents of which are incorporated herein by reference.

BACKGROUND OF THE INVENTION (i) Field of the Invention

A certain aspect of the present invention relates to semiconductor devices. Another aspect of the present invention relates to a semiconductor device that has a field plate formed on a silicon nitride film between a gate electrode and a drain electrode.

(ii) Description of the Related Art

By a known technique for semiconductor devices that perform high-voltage operations, a field plate is formed on an insulating film between the gate electrode and the drain electrode (National Publication of International Patent Application No. 2007-537593, for example). The potential of the field plate is set at a predetermined potential (the ground potential, for example), so that the field intensity can be reduced in the vicinity of a region that is located between the gate electrode and the drain electrode and is also located below the field plate. Accordingly, by forming a field plate on a region having a high field intensity, the field intensity between the gate electrode and the drain electrode can be made uniform, and the withstand voltage between the source and the drain or the withstand voltage between the gate and the drain can be made higher. Also, by making the field intensity uniform, current collapses can be restrained. Further, the field plate is formed to cover part of the gate electrode, and is made to have the same potential as that of the source electrode. In this manner, the feedback capacitance between the gate and the drain can be reduced.

As illustrated in FIG. 4 of National Publication of International Patent Application No. 2007-537593, a step portion that reflects the shape of the gate electrode is formed in the insulating film formed to cover the gate electrode, and a field plate is formed along the step portion of the insulating film. In a semiconductor device having such a structure, a failure might occur in a high-temperature, high-voltage operation.

SUMMARY

According to an aspect of the present invention, there is provided a semiconductor device including: a semiconductor layer formed on a substrate, the semiconductor layer having an active region on a plane; a source electrode and a drain electrode formed on the active region of the semiconductor layer; a gate electrode formed on the active region of the semiconductor layer, the gate electrode being located between the source electrode and the drain electrode; a first insulating film formed on the semiconductor layer and covering the gate electrode, the first insulating film having a step portion following a shape of the gate electrode; a first field plate formed on the insulating film and located between the gate electrode and the drain electrode and separated from the step portion, the first field plate being electrically connected to the source electrode via outside of the active region; a second insulating film formed on the first insulating film to cover the step portion and the first field plate; and a shield electrode formed on the second insulating film, the shield electrode extending from a portion located above the first field plate and a portion located above the gate electrode, the shield electrode being electrically connected to the source electrode.

DETAILED DESCRIPTION

Figure 1:
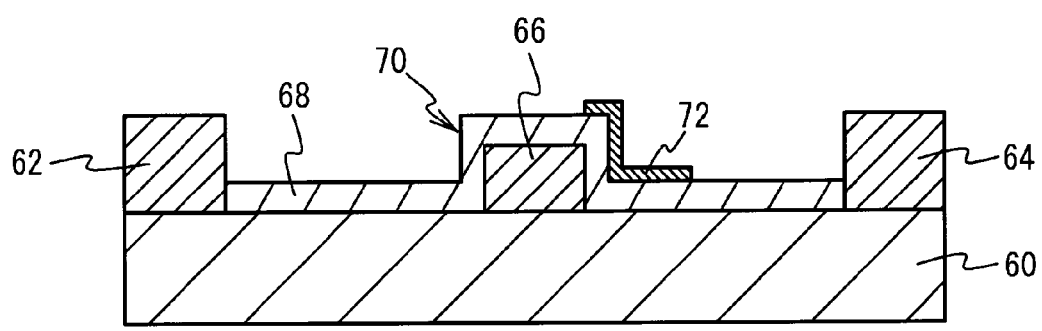
FIG. 1 is a schematic cross-sectional view of a semiconductor device according to Comparative Example 1.

First, the problems to be solved by the present invention are described in detail, through explanation of a semiconductor device according to Comparative Example 1. FIG. 1 is a schematic cross-sectional view of a semiconductor device according to Comparative Example 1. As illustrated in FIG. 1, a source electrode 62, a drain electrode 64, and a gate electrode 66 are formed on a semiconductor layer 60 that has a seed layer, a GaN electron transit layer, an AlGaN electron supply layer, and a GaN cap layer stacked sequentially on a SiC substrate, for example. The gate electrode 66 is formed between the source electrode 62 and the drain electrode 64. A silicon nitride film 68 is formed on the semiconductor layer 60, so as to cover the gate electrode 66. A step portion 70 that reflects the shape of the gate electrode 66 is formed in the silicon nitride film 68. A field plate 72 extending along the step portion 70 is formed on a portion of the surface of the silicon nitride film 68 between the gate electrode 66 and the drain electrode 64. The field plate 72 is electrically connected to the source electrode 62.

Failures that occurred in the semiconductor device according to Comparative Example 1 were analyzed. The results of the analysis showed that a breakdown occurred between the gate electrode 66 and the field plate 72, particularly, in the silicon nitride film 68 at the step portion 70. The gate electrode 66 and the field plate 72 can be regarded as a capacitor having the silicon nitride film 68 serving as a dielectric material interposed in between. The silicon nitride film 68 at the step portion 70 has a small film thickness and is poor in film quality. Therefore, it is considered that the portion between the gate electrode 66 and the field plate 72 did not have a sufficiently long service life to endure the temperatures and voltages in actual operations. Particularly, in a semiconductor device that is used as a high-frequency, high-power device, and includes a nitride semiconductor, a high voltage of 50 V is applied to the drain electrode 64, for example. The voltage applied to the gate electrode 66 is also high. Therefore, it is believed that, due to the potential difference between the field plate 72 electrically connected to the source electrode 62 and the gate electrode 66, a breakdown easily occurs at the step portion 70 that is formed between the field plate 72 and the gate electrode 66 and has poor film quality in the silicon nitride film 68.

In view of the above, a capacitor was manufactured by forming a silicon nitride film to cover a lower electrode (equivalent to the above described gate electrode), and forming an upper electrode (equivalent to the above described field plate) on the silicon nitride film. The upper electrode extended along a step portion that reflected the shape of the lower electrode and was formed in the silicon nitride film. A TDDB (Time Dependent Dielectric Breakdown) test was then conducted. As a result, it became apparent that an initial failure that was far cry from that in a capacitor having a flat structure occurred. For example, when the 0.1% failure time that was an indicator of reliability requirement was estimated, the service life was 0.8 year at a voltage of 20 V and at an operating temperature of 200° C., and was about 5 years even at a voltage of 10 V. This is the problem to be solved to realize higher-temperature, higher-voltage operations in a semiconductor device having the structure illustrated in FIG. 1. Therefore, to solve such a problem, embodiments of semiconductor devices described below prevent failures even in high-temperature, high-voltage operations.

(First Embodiment)

Figure 2:
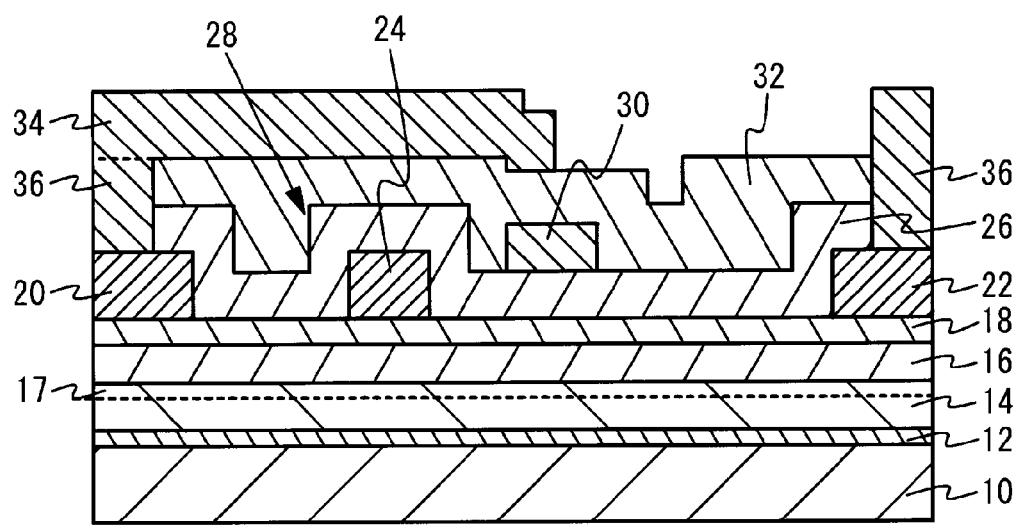
FIG. 2 is a schematic cross-sectional view of a semiconductor device according to a first embodiment.

FIG. 2 is a schematic cross-sectional view of a semiconductor device according to a first embodiment. The first embodiment concerns an example case of a HEMT of a nitride semiconductor. As illustrated in FIG. 2, in the semiconductor device according to the first embodiment, a seed layer 12 made of AlN (aluminum nitride), a GaN electron transit layer 14, an n-type AlGaN electron supply layer 16, and an n-type GaN cap layer 18 are stacked in this order on a SiC (silicon carbide) substrate 10, for example. The thickness of the seed layer 12 is 300 nm, for example. The thickness of the GaN electron transit layer 14 is 1000 nm, for example. The thickness of the AlGaN electron supply layer 16 is 20 nm, for example. The thickness of the GaN cap layer 18 is 5 nm, for example. A 2DEG (two-dimensional electron gas) is generated in the interface between the GaN electron transit layer 14 and the AlGaN electron supply layer 16, to form a channel layer 17. It should be noted that the substrate 10 may be a sapphire substrate or a Si (silicon) substrate, instead of a SiC substrate.

A source electrode 20 and a drain electrode 22 are formed on part of the surface of the GaN cap layer 18. The source electrode 20 and the drain electrode 22 each have a two-layer structure formed by stacking Ta (tantalum) and Al (aluminum) in this order from the side of the GaN cap layer 18, for example. A gate electrode 24 is formed on a portion of the surface of the GaN cap layer 18 between the source electrode and the drain electrode 22. The gate electrode 24 has a two-layer structure formed by stacking Ni (nickel) and Au (gold) from the side of the GaN cap layer 18, for example.

A first silicon nitride film 26 is formed on the GaN cap layer 18, to cover the gate electrode 24. The thickness of the first silicon nitride film 26 is 400 nm, for example. A step portion 28 that reflects the shape of the gate electrode 24 is formed in the first silicon nitride film 26. A first field plate 30 that has a thickness of 200 to 300 nm and is made of Au is formed in contact with a portion of the upper face of the first silicon nitride film 26 between the gate electrode 24 and the drain electrode 22. The first field plate 30 is formed on a flat face located at a distance from the step portion 28, so as not to overlap with the step portion 28.

A second silicon nitride film 32 is formed in contact with the upper face of the first silicon nitride film 26, so as to cover the first field plate 30. The thickness of the second silicon nitride film 32 is 400 nm, for example. A shield electrode 34 is formed in contact with the upper face of the second silicon nitride film 32. The shield electrode 34 extends from the portion located above the first field plate 30 to the portion located above the source electrode 20 via the portion located above the gate electrode 24.

Extraction interconnects 36 that are in contact with the upper faces of the source electrode 20 and the drain electrode 22, and penetrate through the first silicon nitride film 26 and the second silicon nitride film 32 are provided. The extraction interconnect 36 formed in contact with the upper face of the source electrode 20 is connected to the shield electrode 34. That is, the shield electrode 34 is connected to the source electrode 20 through the portion located above the gate electrode 24. Accordingly, the shield electrode 34 is electrically connected to the source electrode 20, and has the same potential as that of the source electrode 20. The shield electrode 34 also functions as an extraction interconnect. Therefore, the shield electrode 34 has a thickness of 1 to 3 μm, and is made of Au. The shield electrode 34 and the first field plate 30 are electrically connected to each other via the extraction interconnect 36 and a through interconnect outside the active region. That is, the first field plate 30 is also electrically connected to the source electrode 20, and has the same potential as that of the source electrode 20.

Figure 3:
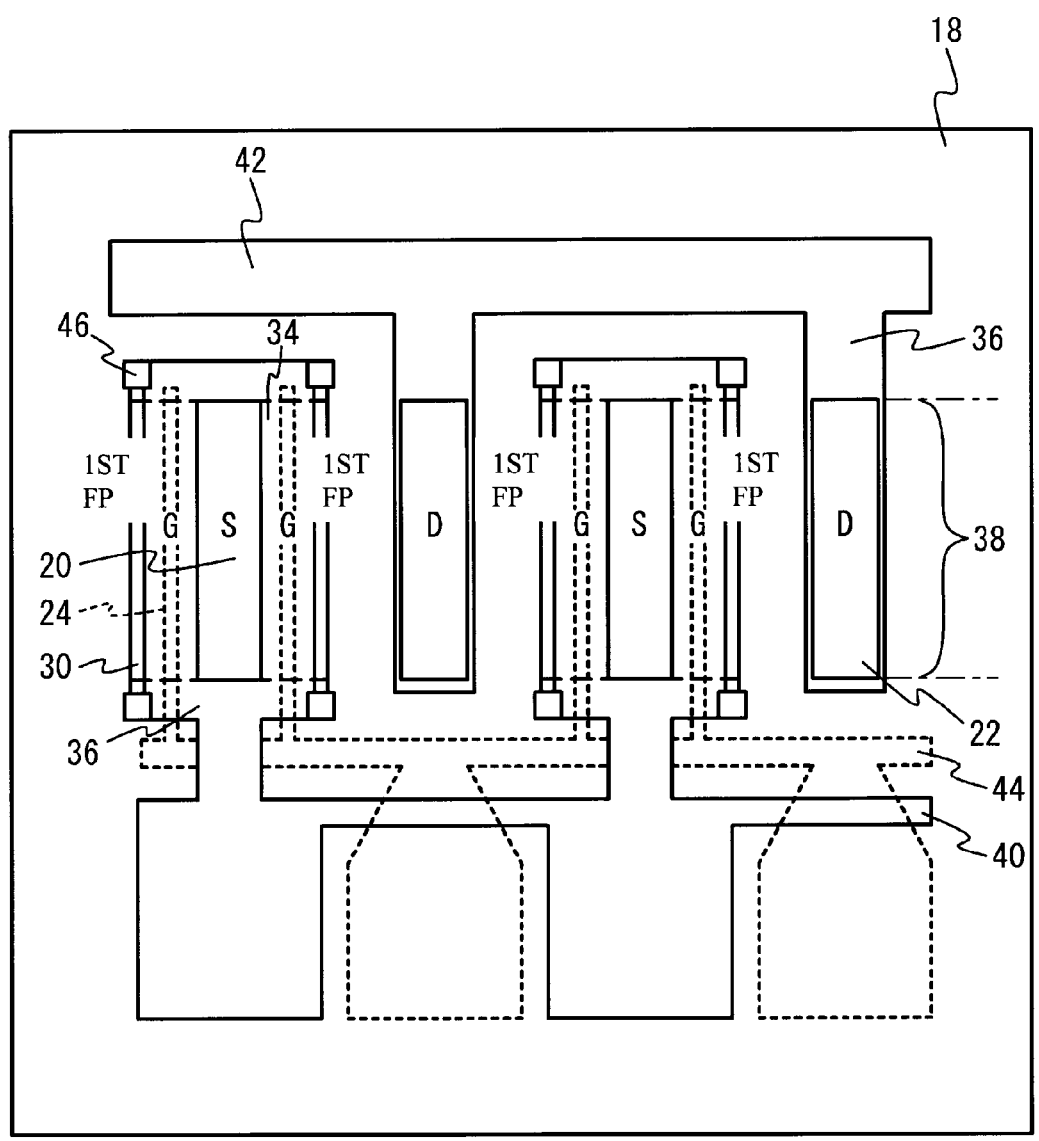
FIG. 3 is a schematic plan view of the semiconductor device according to the first embodiment.

FIG. 3 is a schematic plan view of the semiconductor device according to the first embodiment. As illustrated in FIG. 3, the source electrodes 20, the drain electrodes 22, and the gate electrodes 24 are formed on the GaN cap layer 18. The source electrodes 20, the drain electrodes 22, and the gate electrodes 24 extend in the same direction. The direction in which the source electrodes 20 and the like extend is called "finger direction". The source electrodes 20 are arranged parallel to one another in the active region 38. The drain electrodes 22 are arranged parallel to one another in the active region 38 so that the drain electrodes 22 and the source electrodes 20 are alternately arranged. The gate electrodes 24 are arranged parallel to one another in the portions of the active region 38 between the source electrodes 20 and the drain electrodes 22. The region with which the source electrodes 20, the drain electrodes 22, and the gate electrodes 24 intersect is the active region 38.

The source electrodes 20 are connected to a source bus line 40 outside the active region 38, via the extraction interconnects 36. Likewise, the drain electrodes 22 are connected to a drain bus line 42 outside the active region 38, via the extraction interconnects 36. The gate electrodes 24 are connected to a gate bus line 44 outside the active region 38.

The source bus line 40 and the drain bus line 42 are located on the opposite sides of the active region 38 from each other, and the gate bus line 44 is provided on the same side as the source bus line 40.

The first field plates 30 are provided between the respective electrodes 24 and the respective drain electrodes 22. The first field plates 30 extend in the finger direction across the entire active region 38. Each shield electrode 34 is formed to extend from one of the two first field plates 30 located on both sides of each corresponding source electrode 20 to the other one of the two first field plates 30. That is, the shield electrodes 34 are formed to cover the upper faces of the first field plates 30, the gate electrodes 24, and the source electrodes 20. The first field plates 30 are electrically connected to the source electrodes 20 via through interconnects 46 formed to penetrate through the second silicon nitride film 32 outside the active region 38, and the extraction interconnects 36 extending outside the active region 38. That is, the first field plates 30 and the source electrodes 20 are electrically connected outside the active region 38. In other words, the shield electrodes 34 and the first field plates 30 are electrically connected via the through interconnects 46 penetrating through the second silicon nitride film 32 and the extraction interconnects 36, outside the active region 38.

The first field plates 30 and the shield electrodes 34 are preferably commonly connected to the source electrodes 20 in an electrical manner. In a case where the first field plates 30 and the shield electrodes 34 are connected inside the active region 38, the regions for connecting the first field plates 30 and the shield electrodes 34 need to be secured in the first field plates 30. The shape of each first field plate 30 is designed by taking into account the field reduction effect and the coupling capacitance with the drain. However, if the regions for connections are secured as above, the designed shape is changed. Therefore, the first field plates 30 and the source electrodes 20 are preferably electrically connected only outside the active region 38. As the first field plates 30 and the source electrodes 20 are connected outside the active region 38 in the first embodiment, a change in the shape of the first field plates 30 inside the active region 38 can be prevented, and degradation of characteristics can be avoided. It should be noted that various structures may be employed to prevent a change in the shape of the first field plates 30 inside the active region 38. For example, the first field plates 30 may be connected to the source electrodes 20 by interconnects that extend outside the active region 38, and the shield electrodes 34 may be connected to the source electrodes 20 through regions located above the gate electrodes 24.

Figure 4A:
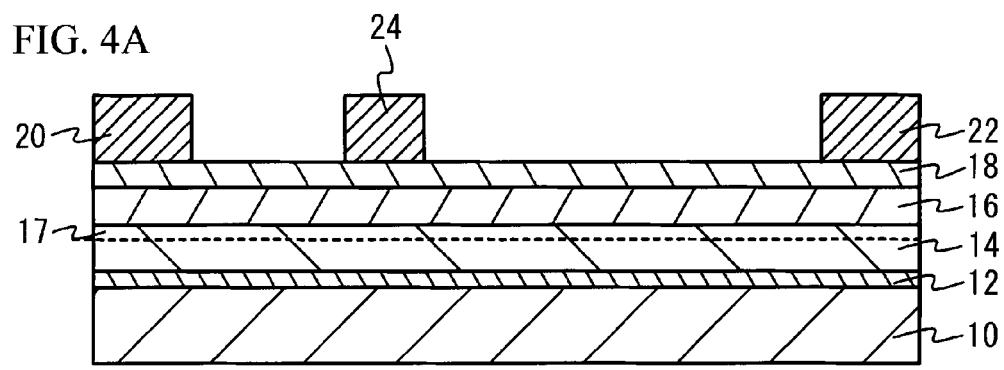
FIGS. 4A through 4C are schematic cross-sectional views illustrating a method of manufacturing the semiconductor device according to the first embodiment.
Figure 4B:
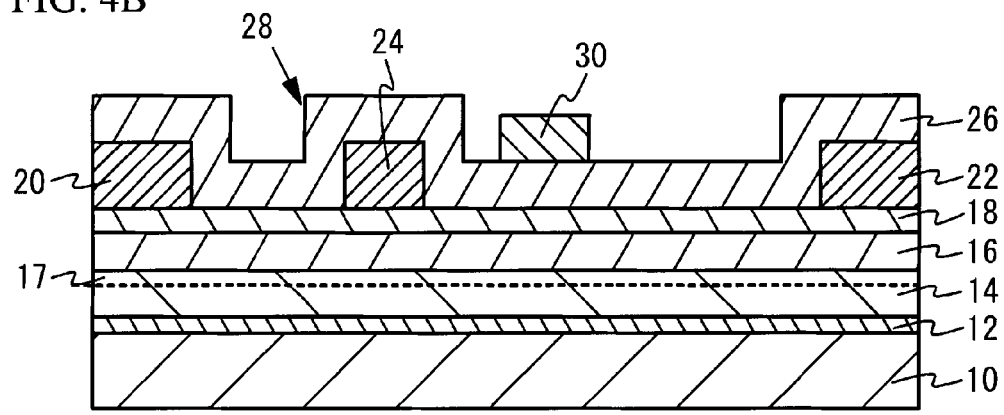
Figure 4C:
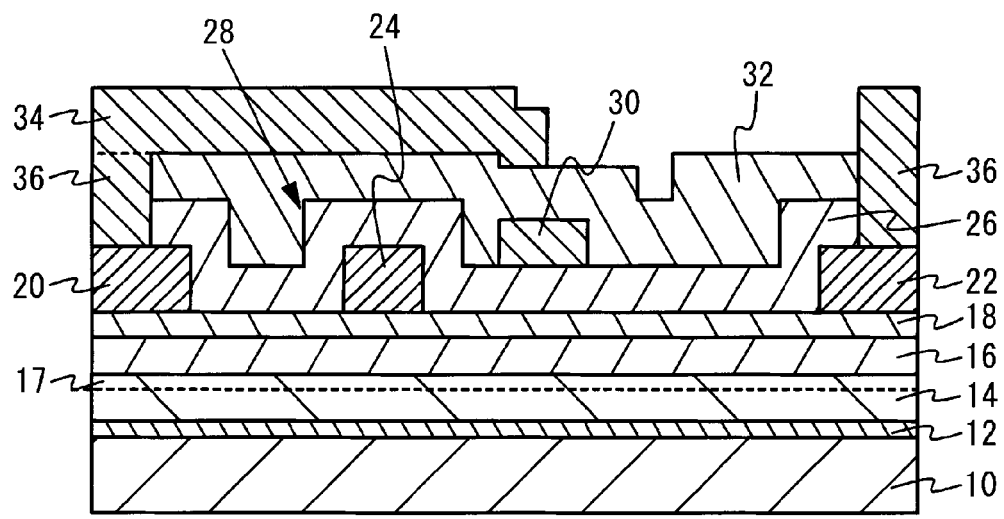

Next, a method of manufacturing the semiconductor device according to the first embodiment is described. FIGS. 4A through 4C are schematic cross-sectional views illustrating the method of manufacturing the semiconductor device according to the first embodiment. As illustrated in FIG. 4A, the seed layer 12, the GaN electron transit layer 14, the AlGaN electron supply layer 16, and the GaN cap layer 18 are sequentially stacked through epitaxial growth on the SiC substrate 10 by MOCVD (metalorganic chemical vapor deposition), for example. The source electrode 20 and the drain electrode 22 are formed on the upper face of the GaN cap layer 18 by a vapor deposition technique and a liftoff technique, for example. After that, annealing is performed at a temperature of 500 to 800° C., for example, to form the source electrode 20 and the drain electrode 22 as ohmic electrodes that are in ohmic-contact with the AlGaN electron supply layer 16. The gate electrode 24 is then formed on the upper face of the portion of the GaN cap layer 18 between the source electrode 20 and the drain electrode 22 by a vapor deposition technique and a liftoff technique, for example.

As illustrated in FIG. 4B, the first silicon nitride film 26 is formed to cover the gate electrode 24 by plasma CVD (plasma chemical vapor deposition), for example. The step portion 28 that reflects the shape of the gate electrode 24 is formed in the first silicon nitride film 26. By a vapor deposition technique and a liftoff technique, for example, the first field plate 30 is formed on a flat face that is a portion of the upper face of the first silicon nitride film 26 between the gate electrode 24 and the drain electrode 22. The flat face does not overlap with the step portion 28.

As illustrated in FIG. 4C, by plasma CVD, for example, the second silicon nitride film 32 is formed on the upper face of the first silicon nitride film 26, to cover the first field plate 30. The portions of the first silicon nitride film 26 and the second silicon nitride film 32 located on the source electrode 20 and the drain electrode 22 are then removed by etching, for example, to form openings. By a plating technique, for example, the extraction interconnects 36 are formed to fill the openings, and the shield electrode 34 extending from the portion located above the first field plate 30 to the portion located above the source electrode 20 is formed on the upper face of the second silicon nitride film 32. In this manner, the semiconductor device according to the first embodiment is completed.

As described above, according to the first embodiment, the first field plate 30 is formed on a flat face that is located between the gate electrode 24 and the drain electrode 22. The flat face is in contact with the upper face of the first silicon nitride film 26 covering the gate electrode 24, and is at a distance from the step portion 28. Also, the first field plate 30 is electrically connected to the source electrode 20. With this arrangement, the field reduction effect between the gate electrode 24 and the drain electrode 22 is achieved, and a higher withstand voltage between the source and drain or a higher withstand voltage between the gate and drain, and prevention of current collapses can be realized. At the same time, the distance between the gate electrode 24 and the first field plate 30, between which the step portion 28 having poor film quality in the first silicon nitride film 26 is formed, can be made longer, and a higher withstand voltage can be secured.

The shield electrode 34 is formed in contact with the upper face of the second silicon nitride film 32, which is formed in contact with the upper face of the first silicon nitride film 26 so as to cover the first field plate 30. The shield electrode 34 extends from the portion located above the first field plate 30 to the portion located above the gate electrode 24. The shield electrode 34 is also electrically connected to the source electrode 20. With this arrangement, the gate electrode 24 can be shielded from the electric field generated from the drain electrode 22. Also, the distance between the gate electrode 24 and the shield electrode 34, between which the step portion 28 having poor film quality in the first silicon nitride film 26 is formed, can be made longer, and a high withstand voltage can be secured.

As described above, according to the first embodiment, withstand voltages between the gate electrode 24 and the first field plate 30, and between the gate electrode 24 and the shield electrode 34 can be secured. Accordingly, even in high-temperature, high-voltage operations, breakdowns of the first silicon nitride film 26 at the step portion 28 can be prevented, and occurrences of failures can be restrained.

In the example case described in the first embodiment, the thickness of the first silicon nitride film 26 is 400 nm. However, the thickness of the first silicon nitride film 26 is not limited to that. If the first silicon nitride film 26 is too thick, the field reduction effect of the first field plate 30 cannot be readily obtained, and therefore, a thick first silicon nitride film 26 is not preferable. If the thickness of the first silicon nitride film 26 is greater than 600 nm, a breakdown does not easily occur at the step portion 28. Therefore, the thickness of the first silicon nitride film 26 is preferably equal to or smaller than 600 nm. It the first silicon nitride film 26 is too thin, a breakdown easily occurs not only at the step portion 28, but also in the first silicon nitride film 26. Therefore, the thickness of the first silicon nitride film 26 is preferably equal to or greater than 200 nm. Accordingly, the thickness of the first silicon nitride film 26 is preferably in the range of 200 to 600 nm, more preferably, in the range of 300 to 500 nm, and even more preferably, in the range of 300 to 400 nm.

In the first embodiment, an example case of a HEMT of a nitride semiconductor has been described, but the present invention is not limited to that. For example, the first embodiment may be a HEMT having a III-V compound semiconductor layer containing arsenic, or any semiconductor device other than a HEMT having a III-V compound semiconductor layer containing nitrogen or arsenic. Particularly, a semiconductor device that operates on high power is preferable. Examples of III-V compound semiconductors containing nitrogen include GaN, InN, AlN, AlGaN, InGaN, and AlInGaN. Examples of III-V compound semiconductors containing arsenic include GaAs, InAs, AlAs, InGaAs, AlGaAs, and InAlGaAs.

(Second Embodiment)

Figure 5:
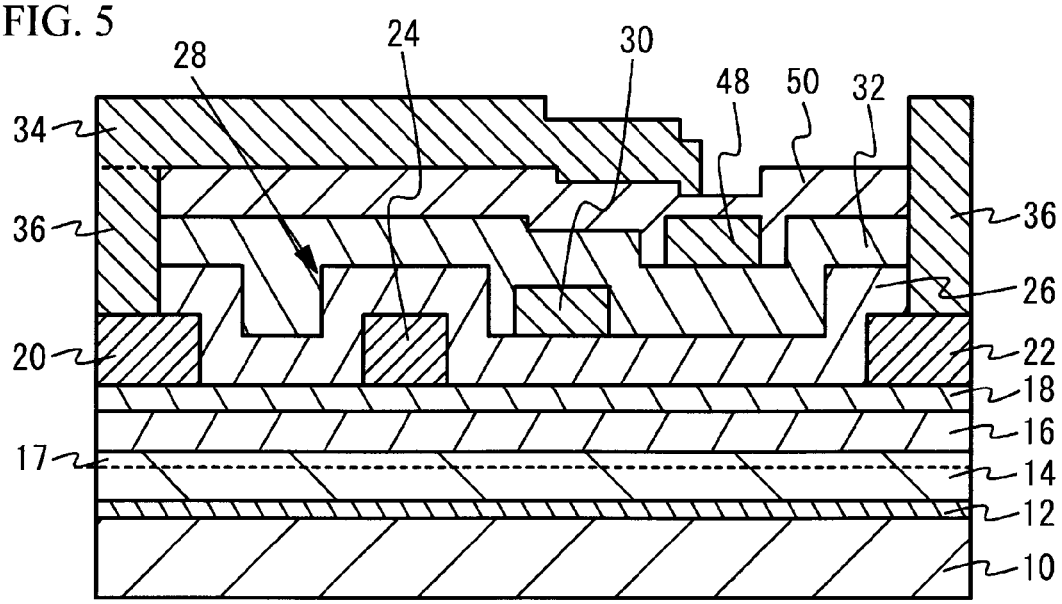
FIG. 5 is a schematic cross-sectional view of a semiconductor device according to a second embodiment.

FIG. 5 is a schematic cross-sectional view of a semiconductor device according to a second embodiment. As illustrated in FIG. 5, the differences from the semiconductor device according to the first embodiment are as follows. A second field plate 48 that has a thickness of 200 to 300 nm and is made of Au is formed between the first field plate 30 and the drain electrode 22. A third silicon nitride film 50 is formed in contact with the upper face of the second silicon nitride film 32, so as to cover the second field plate 48. The shield electrode 34 is formed in contact with the upper face of the third silicon nitride film 50, and extend from the portion located above the second field plate 48 to the portion located above the source electrode 20. The other aspects of the structure are the same as those of the first embodiment illustrated in FIG. 2, and therefore, explanation of them is omitted herein.

Figure 6:
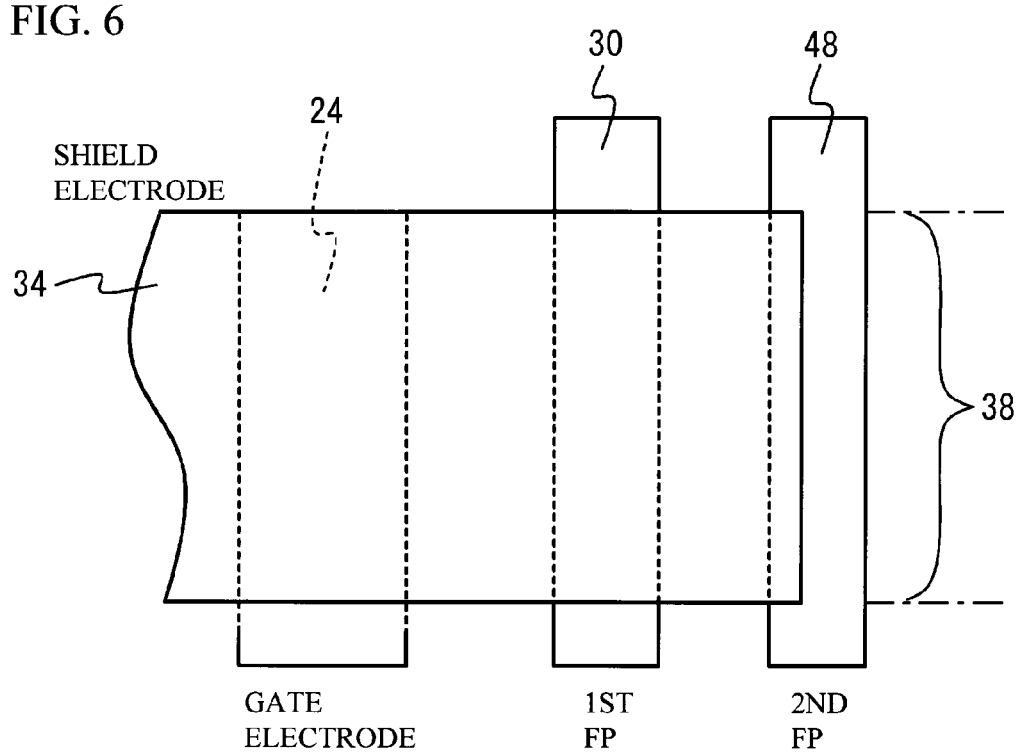
FIG. 6 is a schematic plan view for explaining the positional relationships among the gate electrode, the first field plate, the shield electrode, and the second field plate of the semiconductor device according to the second embodiment.

FIG. 6 is a schematic plan view for explaining the positional relationships among the gate electrode 24, the first field plate 30, the shield electrode 34, and the second field plate 48. As illustrated in FIG. 6, the first field plate 30 and the second field plate 48 are formed to extend across the active region 38. The shield electrode 34 extends from the portion located above the second field plate 48 to the portion located above the source electrode 20 via the portion located above the gate electrode 24. That is, the shield electrode 34 is formed to cover the upper faces of the second field plate 48, the first field plate 30, and the gate electrode 24. The second field plate 48 and the shield electrode 34 are electrically connected via an extraction interconnect 36 and a through interconnect outside the active region 38, and the first field plate 30 and the shield electrode 34 are electrically connected via the extraction interconnect 36 and a through interconnect outside the active region 38. Accordingly, the first field plate 30 and the second field plate 48 each have the same potential as that of the source electrode 20. The other aspects of the structure are the same as those of the first embodiment illustrated in FIG. 3, and therefore, explanation of them is omitted herein.

The semiconductor device according to the second embodiment can be manufactured in the following manner. After the formation of the second silicon nitride film 32 illustrated in FIG. 4C, the second field plate 48 is formed by a vapor deposition technique and a liftoff technique, for example. The third silicon nitride film 50 is then formed by plasma CVD, for example. The extraction interconnects 36 and the shield electrode 34 are then formed.

According to the second embodiment, the second field plate 48 is formed between the first field plate 30 and the drain electrode 22, and the second field plate 48 is in contact with the upper face of the second silicon nitride film 32. With this arrangement, a greater field reduction effect between the gate electrode 24 and the drain electrode 22 can be achieved.

Also, the shield electrode 34 is formed to extend from the portion located above the second field plate 48 to the portion located above the gate electrode 24. With this arrangement, the gate electrode 24 can be shielded from the electric field generated from the drain electrode 22.

In the second embodiment, the shield electrode 34 is formed in contact with the upper face of the third silicon nitride film 50 covering the second field plate 48, and extend from the portion located above the second field plate 48 to the portion located above the gate electrode 24. However, the present invention is not limited to that. For example, the shield electrode 34 may be formed in contact with the upper face of the third silicon nitride film 50, and extend from the portion located above the first field plate 30 to the portion located above the gate electrode 24. Alternatively, the third silicon nitride film 50 may not be formed, and the shield electrode 34 may be formed in contact with the upper face of the second silicon nitride film 32, and extend from the portion located above the first field plate 30 to the portion located above the gate electrode 24. In any of those cases, the gate electrode 24 can also be shielded from the electric field generated from the drain electrode 22.

(Third Embodiment)

Figure 7:
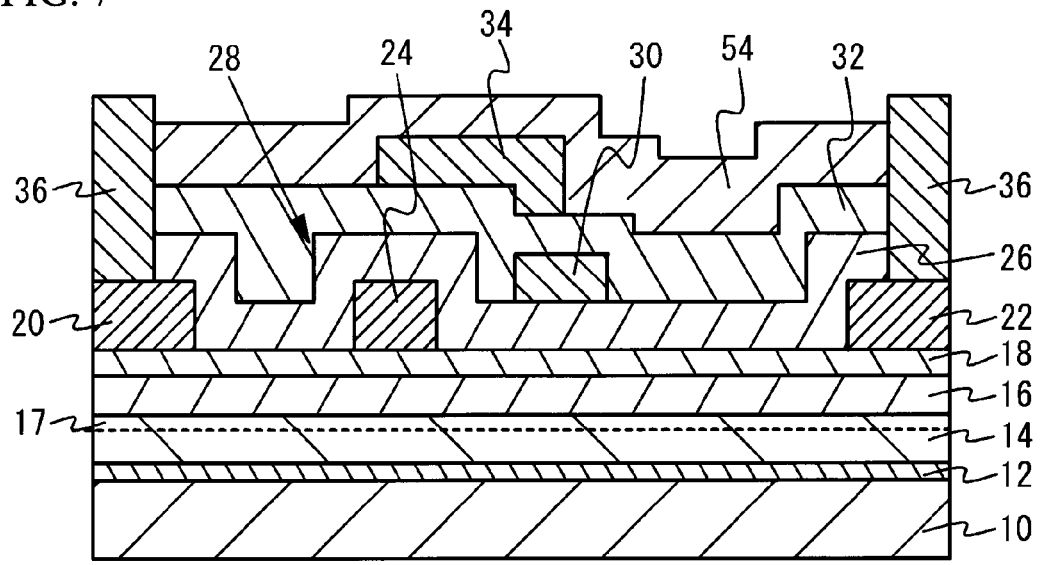
FIG. 7 is a schematic cross-sectional view of a semiconductor device according to a third embodiment.

FIG. 7 is a schematic cross-sectional view of a semiconductor device according to a third embodiment. As illustrated in FIG. 7, the shield electrode 34 formed in contact with the upper face of the second silicon nitride film 32 extends from the portion located above the first field plate 30 to the portion located above the gate electrode 24, but does not extend to the portion located above the source electrode 20. An insulating film 54 that is a silicon nitride film, for example, is formed in contact with the upper face of the second silicon nitride film 32, so as to cover the shield electrode 34. That is, unlike the shield electrode 34 in the first embodiment, the shield electrode 34 does not have the function of an extraction interconnect. The other aspects of the structure are the same as those of the semiconductor device according to the first embodiment illustrated in FIG. 2, and therefore, explanation of them is omitted herein.

Figure 8:
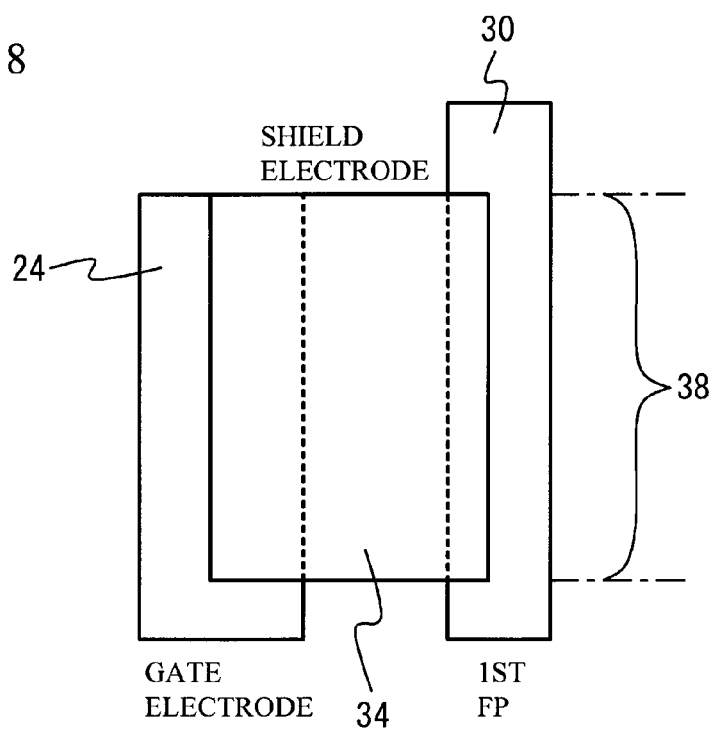
FIG. 8 is a schematic plan view for explaining the positional relationships among the gate electrode, the first field plate, and the shield electrode of the semiconductor device according to the third embodiment.

FIG. 8 is a schematic plan view for explaining the positional relationships among the gate electrode 24, the first field plate 30, and the shield electrode 34. As illustrated in FIG. 8, the first field plate 30 is formed to extend across the active region 38. The shield electrode 34 extends from the portion located above the first field plate 30 to the portion located above the gate electrode 24. That is, the shield electrode 34 is formed to cover the upper faces of the first field plate 30 and the gate electrode 24. The extraction interconnect 36 and the first field plate 30 that are electrically connected to the source electrode 20 are electrically connected via a through interconnect outside the active region 38. The extraction interconnect 36 and the shield electrode 34 that are electrically connected to the source electrode 20 are also electrically connected via a through interconnect outside the active region 38. The other aspects of the structure are the same as those of the first embodiment illustrated in FIG. 3, and therefore, explanation of them is omitted herein.

The semiconductor device according to the third embodiment can be manufactured in the following manner. After the formation of the second silicon nitride film 32 illustrated in FIG. 4C, the shield electrode 34 is formed by a vapor deposition technique and a liftoff technique, for example. After that, the insulating film 54 is formed by plasma CVD, for example. The extraction interconnects 36 are then formed.

According to the third embodiment, the first field plate 30 is covered with the second silicon nitride film 32 and the insulating film 54, and the shield electrode 34 is covered with the insulating film 54. With this arrangement, the first field plate 30 and the shield electrode 34 can be buried in an insulating film, and the moisture resistance of the semiconductor device can be improved.

In the example case described in the third embodiment, the insulating film 54 is a silicon nitride film. However, the insulating film 54 is not limited to that, and may be an insulating film made of any other material, such as a silicon oxide ($SiO_2$) film or a silicon oxynitride (SiON) film. Also, as in the second embodiment, a second field plate in contact with the upper face of the second silicon nitride film 32 may be formed between the first field plate 30 and the drain electrode 22, and the insulating film 54 may be formed on the upper face of the second silicon nitride film 32, so as to cover the shield electrode 34 and the second field plate.

Although a few preferred embodiments of the present invention have been illustrated and described, it would be appreciated by those skilled in the art that changes may be made in these embodiments without departing from the principles and spirit of the invention, the scope of which is defined in the claims and their equivalents.

What is claimed is:

1. A semiconductor device comprising:
   a semiconductor layer formed on a substrate, the semiconductor layer having an active region on a plane;
   a source electrode and a drain electrode formed on the active region of the semiconductor layer;
   a gate electrode formed on the active region of the semiconductor layer, the gate electrode being located between the source electrode and the drain electrode;
   a first insulating film formed on the semiconductor layer and covering the gate electrode, the first insulating film having a step portion following a shape of the gate electrode;
   a first field plate formed on the first insulating film and located between the gate electrode and the drain electrode and separated from the step portion, the first field plate being electrically connected to the source electrode via outside of the active region;
   a second insulating film formed on the first insulating film to cover the step portion and the first field plate; and
   a shield electrode formed on the second insulating film, the shield electrode extending from a portion located above the first field plate and a portion located above the gate electrode, the shield electrode being electrically connected to the source electrode,
   wherein the first field plate and the shield electrode are electrically connected by a through interconnect, the through interconnect is formed through the second insulating film and provided outside of the active region.

2. The semiconductor device according to claim 1, wherein the first insulating film has a thickness of 200 nm to 600 nm.

3. The semiconductor device according to claim 1, wherein the semiconductor layer is one of a III-V compound semiconductor layer containing nitrogen and a III-V compound semiconductor layer containing arsenic.

4. The semiconductor device according to claim 1, wherein the first field plate is connected to the source electrode by the through interconnect, and
   the shield electrode is connected to the source electrode through a portion located above the gate electrode.

5. The semiconductor device according to claim 1, wherein the first field plate is formed on a flat face of the first insulating film.

6. The semiconductor device according to claim 1, wherein the first insulating film and second insulating are silicon nitride films.

7. The semiconductor device according to claim 1, wherein the first insulating film has a thickness of 300 nm to 400 nm.

8. The semiconductor device according to claim 1, wherein the semiconductor layer is one of GaN, InN, AlN, AlGaN, InGaN, AlInGaN, GaAs, InAs, AlAs, InGaAs, AlGaAs and InAlGaAs.

9. The semiconductor device according to claim 1, wherein the first field plate is contact with a surface of the first insulating film.

10. The semiconductor device according to claim 9, wherein the first insulating film is silicon nitride and has a thickness of 200 nm to 600 nm.

11. The semiconductor device according to claim 10, wherein the first insulating film has a thickness of 300 nm to 400 nm.

12. The semiconductor device according to claim 1, wherein the shield electrode formed on a step of the second insulating film, the step of the second insulating film following a shape of the step portion of the first insulating film.

13. A semiconductor device comprising:
    a semiconductor layer formed on a substrate, the semiconductor layer having an active region on a plane;
    a source electrode and a drain electrode formed on the active region of the semiconductor layer;
    a gate electrode formed on the active region of the semiconductor layer, the gate electrode being located between the source electrode and the drain electrode;
    a first insulating film formed on the semiconductor layer and covering the gate electrode, the first insulating film having a step portion following a shape of the gate electrode;
    a first field plate formed on the insulating film and located between the gate electrode and the drain electrode and separated from the step portion, the first field plate being electrically connected to the source electrode via outside of the active region;
    a second insulating film formed on the first insulating film to cover the step portion and the first field plate;
    a shield electrode formed on the second insulating film, the shield electrode extending from a portion located above the first field plate and a portion located above the gate electrode, the shield electrode being electrically connected to the source electrode; and
    a second field plate formed on the second insulating film, the second field plate being located between the first field plate and the drain electrode.

14. The semiconductor device according to claim 13, wherein the first field plate, the second field plate and the shield electrode comprise gold.

15. The semiconductor device according to claim 13, wherein the first field plate and the second field plate are electrically connected together by a through interconnect, the through interconnect being formed through the second insulating film and provided outside of the active region.

16. A semiconductor device comprising:
    a semiconductor layer formed on a substrate, the semiconductor layer having an active region on a plane;
    a source electrode and a drain electrode formed on the active region of the semiconductor layer;
    a gate electrode formed on the active region of the semiconductor layer, the gate electrode being located between the source electrode and the drain electrode;
    a first insulating film formed on the semiconductor layer and covering the gate electrode, the first insulating film having a step portion following a shape of the gate electrode;
    a first field plate formed on the insulating film and located between the gate electrode and the drain electrode and separated from the step portion, the first field plate being electrically connected to the source electrode via outside of the active region;

a second insulating film formed on the first insulating film to cover the step portion and the first field plate;

a shield electrode formed on the second insulating film, the shield electrode extending from a portion located above the first field plate and a portion located above the gate electrode, the shield electrode being electrically connected to the source electrode; and another insulating film formed on the shield electrode.

17. The semiconductor device according to claim 16, wherein the another insulating film is one of a silicon nitride film, a silicon oxide film and a silicon oxynitride film.

* * * * *